United States Patent [19]
Bohnert

[11] Patent Number: 5,339,026
[45] Date of Patent: Aug. 16, 1994

[54] FIBER-OPTIC SENSOR WITH FIRST AND SECOND BIMODE FIBERS

[75] Inventor: Klaus Bohnert, Niederrohrdorf, Switzerland

[73] Assignee: Asea Brown Boveri Ltd., Baden, Switzerland

[21] Appl. No.: 936,799

[22] Filed: Aug. 28, 1992

[30] Foreign Application Priority Data

Aug. 29, 1991 [DE] Fed. Rep. of Germany ....... 4128687

[51] Int. Cl.⁵ .......................................... G01R 19/00
[52] U.S. Cl. .................................. 324/96; 250/227.14
[58] Field of Search ................. 324/96, 117 R, 117 H, 324/244.1; 250/227.14, 227.16, 227.17; 356/345; 359/263, 278, 245, 244; 385/2, 8

[56] References Cited

U.S. PATENT DOCUMENTS

| | | | |
|---|---|---|---|
| 4,319,186 | 3/1982 | Kingsley | 324/96 |
| 4,748,686 | 5/1988 | Glomb | 324/96 |
| 4,904,931 | 2/1990 | Miller | 324/96 |
| 4,929,830 | 5/1990 | Bohnert et al. | 324/96 |
| 5,053,693 | 10/1991 | Bohnert et al. | 324/96 |
| 5,053,694 | 10/1991 | Bohnert et al. | 324/96 |

FOREIGN PATENT DOCUMENTS

| | | |
|---|---|---|
| 316619 | 5/1989 | European Pat. Off. |
| 316635 | 5/1989 | European Pat. Off. |
| 393382 | 10/1990 | European Pat. Off. |
| 433824 | 6/1991 | European Pat. Off. |
| 2856183 | 7/1980 | Fed. Rep. of Germany |
| 3027476 | 2/1982 | Fed. Rep. of Germany |
| 3504945 | 11/1985 | Fed. Rep. of Germany |
| 114253.5 | 4/1991 | Fed. Rep. of Germany |
| 4025911 | 4/1991 | Fed. Rep. of Germany |
| 115370.7 | 5/1991 | Fed. Rep. of Germany |

OTHER PUBLICATIONS

Kim, et al., "Use of highly elliptical core fibers for two-mode fiber devices", Sep. 1987, pp. 729-731.
Bohnert, et al., "Fiber-optic sensing of electric field components", Dec. 1988, pp. 4814-4818.
Huang, et al., "Passive Quadrature Phase Detector for Coherent Fiber Optic Systems", 1989, pp. 38-43.
Bohnert, et al., "Fiber-optic sensing of voltages by line integration of the electric field", Mar. 1989, pp. 290-292.
Jackson, et al., "Elimination of drift in a single-mode optical fiber interferometer using a piezoelectrically stretched coiled fiber", 1980, pp. 2926-2929.
Gerges, et al., "Coherence tuned fiber optic sensing system, w/ self-initialization, based on a multimode laser diode", Oct. 1990, pp. 4473-4480.
Ning, et al., "Characteristics of laser diodes for interferometric use", Sep. 1989, pp. 3657-3661.
TEI-91/066 US, document from Asea Brown Boveri, Dr. K. Bohnert, Oct. 19, 1993 total 5 pages.
"Faseroptische Sensoren", Dr. Klaus Bohnert, Bulletin SEV/VSE 82(1991)5.6. Mar. pp. 27-32.

*Primary Examiner*—Vinh Nguyen
*Attorney, Agent, or Firm*—Oblon, Spivak, McClelland, Maier & Neustadt

[57] ABSTRACT

In a fiber optic sensor for measuring electric fields and voltages, in place of a bimode fiber extending between sensor head (14) and evaluation unit (13) two separate bimode fibers (4a, 4b) of the same type are connected in series in the manner of a tandem interferometer. The first bimode fiber (4a) is disposed, together with the sensor element (6), in the sensor head (14). The second bimode fiber (4b) is situated within the separate evaluation unit (13). In this way, the sensor head (14) and the evaluation unit (13) are connected only by insensitive monomode fibers (2a, 2b).

8 Claims, 4 Drawing Sheets

FIBER-OPTIC SENSOR WITH FIRST AND SECOND BIMODE FIBERS

BACKGROUND OF THE INVENTION

1. Field of the Invention

The invention relates to the field of the optical measurement of electrical quantities. It concerns a fiber-optic sensor, comprising
 (a) a light source;
 (b) a piezoelectric sensor element;
 (c) a first bimode fiber with an entrance end and an exit end, in which fiber the $LP_{01}$ fundamental mode and the even $LP_{11}$ mode can propagate, and which fiber is at least partially fixed to the sensor element so that a change in the dimension of the sensor element in an electric field leads to a change in length in the fiber; and
 means for measuring the field-dependent change in length of the fiber.

Such a fiber-optic sensor is known, for example, from EP-A1-0,433,824.

2. Discussion of Background

Fiber-optic sensors for the measurement of electric fields and voltages have already been described in various publications such as, for example, European Patent Applications EP-A1-0,316,619 and EP-A1-0,316,635 or the articles by K. Bohherr and J. Nehring in Appl. Opt. 27, pp. 4814-4818 (1988) or Opt. Lett. 14, pp. 290-292 (1989).

The measurement principle employed in this case is based on the inverse piezoelectric effect in materials with a selected crystal symmetry. The temporally periodic change in dimension which an appropriate piezoelectric body experiences in an alternating electric field is transmitted to a glass fiber fixed to the body.. The change in length of the fiber is then proportional to the field amplitude or voltage amplitude and is interferometrically measured and evaluated.

Various types of glass fiber interferometers may be employed for the interferometric measurement. On account of its simplicity, among these types the bimode fiber interferometer known from the article by B. Y. Kim etal., Opt. Lett. 12, pp. 729-731 (1987) is of particular interest. In this interferometer, the parameters of the sensor fiber are selected so that precisely two modes (the $LP_{01}$ fundamental mode and the even $LP_{11}$ mode) can propagate in the fiber.

In the bimode fiber interferometer, light is passed from a coherent light source, e.g. a laser diode, through a bimode fiber which is fixed to a piezoelectric sensor element for the electric field E. The two modes are excited by the light and propagate differently in the fiber. At the fiber end it is then possible to observe an interference pattern which arises from the superposition of these two modes. In this case, a change in length of the fiber leads to a differential phase shift between the two modes, which is expressed in a corresponding change of the interference pattern.

The two mutually adjacent substructures of the interference pattern are detected by two detectors (e.g. in the form of photodiodes). Two signals $V_{11}$ and $V_{12}$ which are phase-shifted by 180° are present at their output:

$$V_{11} = (\tfrac{1}{2})V_0(1 + a^*\cos\Phi(t)) \qquad (1)$$

$$V_{12} = (\tfrac{1}{2})V_0(1 - a^*\cos\Phi(t)) \qquad (2)$$

with $(t)\Phi = A^*\sin\Omega t + \theta(t)$. The phase shift $\theta(t)$ between the two modes is thus composed of a temporally periodic component $A^*\sin\Omega t$ generated by the alternating field to be measured (in this case, A is proportional to the amplitude of the field) and an arbitrary phase term $\theta(t)$ which may likewise change with time, e.g. in consequence of temperature-dependent fluctuations of the fiber length. Finally, $V_0$ is proportional to the optical power and a is a measure of the interference contrast.

The target term $A^*\sin\Omega t$ is frequently obtained by a homodyne detection process from the output signals of the detectors (in the case of a fiber-optic sensor with a monomode fiber, see in this connection: D. A. Jackson etal., Appl. Opt. 19, pp. 2926-2929 (1980); a corresponding fiber-optic sensor with a bimode fiber is described in the European Application EP-A1-0,433,824 cited in the introduction). In this process, the sensor fiber is additionally guided via a piezoelectric modulator. By means of this modulator 4, the phase difference $\Phi(t)$ is set to $+(pi/2)$ or $-(pi/2)$ (modulo 2pi). To this end, the modulator is a component of a regulating circuit which consists of the detectors, a subtractor and a quadrature regulator and which sets correspondingly to zero the differential voltage $$V = V_{11} - V_{12} = V_0^*a^*\cos\Phi(t) \qquad (3)$$

The two components $A^*\sin\Omega t$ and $\theta(t)$ of the phase shift are thus precisely balanced by the modulator by means of an appropriate (opposite) change in length of the fiber. The voltage present at the modulator then includes a slowly varying component which is proportional to $\theta(t)$ and a periodic component which is proportional to $A^*\sin\Omega t$. The target component $A^*\sin\Omega t$ is filtered out by a high-pass filter and can be picked off at the signal output. As a result of this, the output signal is independent of the possible fluctuations of the laser intensity (i.e. $V_0$) and of the interference contrast a.

In a series of practical applications of the sensor (e.g. in voltage measurement in outdoor substations), relatively large spacings may occur between the actual sensor head and the sensor electronic system (10 m to a few 100 m). It is inexpedient to bridge these spacings using the bimode fiber itself, since the influence of external disturbances (temperature fluctuations, mechanical vibrations etc.) increases correspondingly with increasing fiber length and the signal/noise ratio deteriorates. Rather, the light feed from the laser diode to the interferometer and the return guidance of the output signals of the interferometer should take place via separate glass fibers, which are not a component of the interferometer.

In the above-described homodyne process using an active phase modulator, it would however, be necessary to provide, in addition to the connecting glass fibers, an electrical connection between the sensor electronic system and the sensor head to drive the modulator. The attractiveness of a sensor operating with this type of interferometer would be very greatly restricted by this.

In two older German Patent Applications (file references P 41 14 253 5 and P 41 15 370 7) it has therefore been proposed in place of the known active signal detection, which requires an additional modulator in the measurement fiber with an appropriate electrical supply line, to provide a passive signal detection, which is based on the Guoy effect (in this connection, see: S. Y. Huang et al., Springer Proc. in Physics, Vol. 44 "Optical Fiber Sensors", pp 38–43, Springer Verlag Berlin, Heidelberg (1989)), i.e. the phase difference between the interference patterns of the close field and remote field: in this case, the substructures of the close field and remote field (a total of 4) are separated in the sensor head by optical means and can be transmitted via separate glass fibers to a remote electronic evaluation system. In that system, the desired information on the change in length of the measurement fiber can be obtained by using at least three of these four substructures.

Using this proposed solution, a complete electrical separation is indeed achieved between sensor head and electronic evaluation system. However, this advantage is acquired in consideration of the fact that additional optical components (beam splitter) and a relatively complex electronic system must be employed. Over and above this, it is necessary to use a monomode laser diode, which necessitates special measures for the suppression of the light backscatter from the sensor into the diode.

SUMMARY OF THE INVENTION

Accordingly, one object of the invention is to provide a novel fiber-optic sensor which on the one hand permits a disturbance-insensitive separation of sensor head and electronic evaluation system, but on the other hand is also distinguished by a simple construction and high accuracy of measurement.

In a sensor of the initially mentioned type, this object is achieved in that (e) the light source is a multimode laser diode;
(f) the measuring means comprise a second bimode fiber of the same type as the first;
(g) the parameters of the two bimode fibers are selected so that the interference contrast is approximately equal to zero in each instance for the path differences of both modes in the individual bimode fibers and for the sum of the path differences; and
(h) respective monomode fibers for the transmission of the light are provided between the light source and the entrance end of the first bimode fiber, and the exit end of the first bimode fiber and the entrance end of the second bimode fiber.

The core of the invention is based on applying the principle of white light interferometry for the measurement: the light of a multimode laser diode is fed to the first bimode fiber via the insensitive first monomode fiber. The coupling takes place in such a way that the two modes which are viable for propagation (the $LP_{01}$ fundamental mode and the even $LP_{11}$ mode) are excited, preferably with the same intensity. In the first bimode fiber, the two modes experience an optical path difference delta $L_1$, for which the interference contrast is negligibly small. Thus, at the end of the sensor fiber no interference effects take place. The two modes are coupled, in approximately equal proportions, into a second insensitive monomode fiber and are transmitted to a detection unit. In that unit, the light is again coupled into a second bimode fiber, which is of the same type as, especially identical to, the first bimode fiber, with respect to its fiber parameters and length.

Again, the coupling-in takes place in such a way that both modes are excited to approximately the same extent. Light which has propagated in the first bimode fiber in the fundamental mode $LP_{01}$ propagates in approximately equal proportions in the $LP_{01}$ and in the even $LP_{11}$ mode of the second bimode fiber. The same applies to light which has propagated in the first bimode fiber in the $LP_{11}$ mode.

At the exit end of the second bimode fiber there are, between the light waves of the $LP_{01}$ mode on the one hand and the waves of the $LP_{11}$ mode on the other hand, path differences of zero, delta $L_1$ and 2*delta $L_1$. Mode components with the path difference zero then interfere with one another, while the other components deliver a constant intensity background.

It should be pointed out, at this point, that such a system, which is designated as a tandem interferometer, is in principle already known from the prior art for conventional interferometers (Michelson) (see for example, A. S. Gerges et al., Appl. Optics Vol. 29, No. 30, pp. 4473–4480 (1990)).

A preferred embodiment of the invention is defined in that
(a) the second bimode fiber is at least partially fixed to a piezoelectric modulator;
(b) two detectors for measuring the intensities of the two modes are disposed at the exit end of the second bimode fiber;
(c) the output signals of the two detectors pass via a subtractor to the input of a quadrature regulator;
(d) the output of the quadrature regulator controls the modulator; and
(e) the output signal of the quadrature regulator is passed via a high pass filter to a signal output.

Such a homodyne detection, which is known per se, with active operating-point control and compensation of the AC measurement signal has the advantage of a high measurement sensitivity, with high stability at the same time.

Further embodiments are evident from the subclaims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
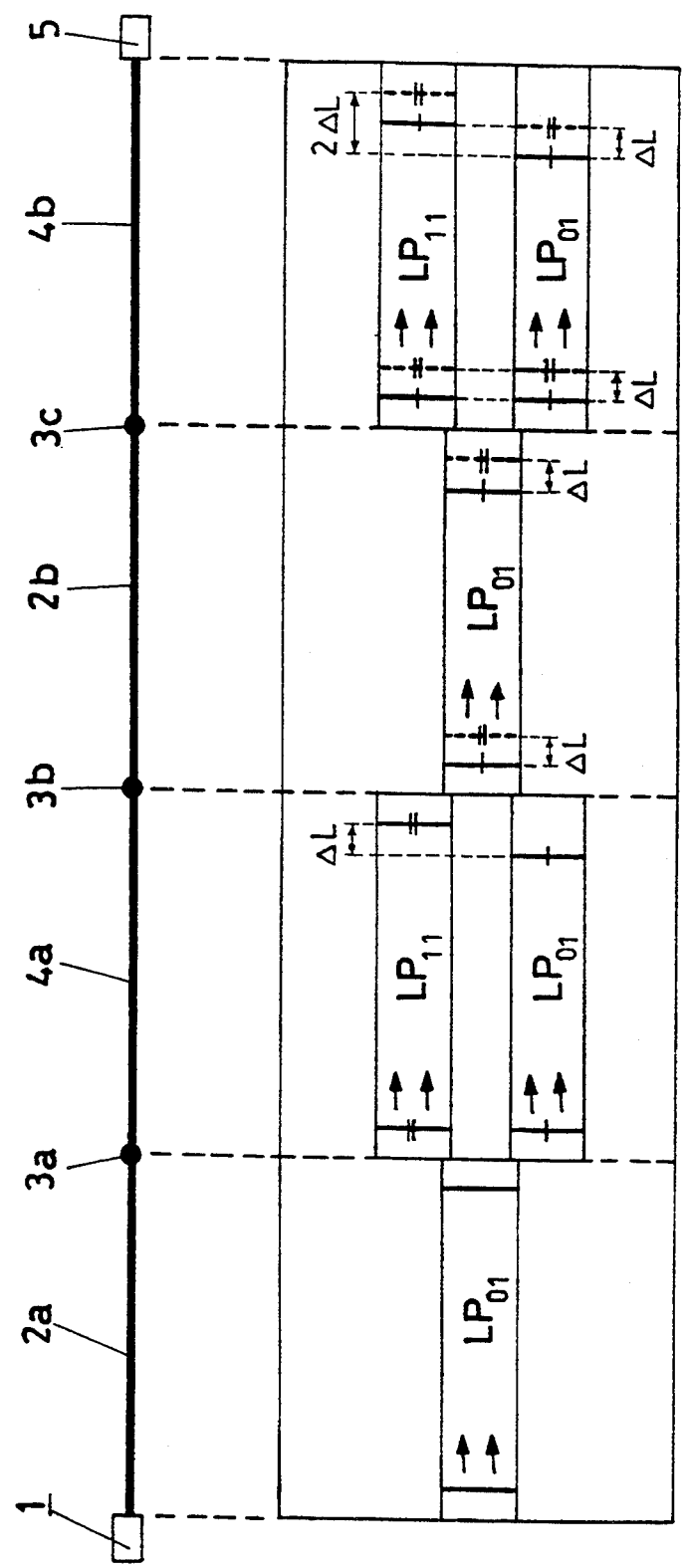
FIG. 1 shows the basic diagram of a tandem interferometer with bimode fibers according to the invention.

Referring now to the drawings, wherein like reference numerals designate identical or corresponding parts throughout the several views, in FIG. 1 the basic (diagrammatic) structure of a sensor according to the invention and the propagation of a wave front of an individual, arbitrarily selected wave train are shown. The light from a light source 1, a multimode laser diode, propagates in the first instance as the fundamental mode $LP_{01}$ of a first (polarization-conserving) monomode fiber 2a. The wave front under consideration excites, in a first bimode fiber 4a connected by a first splice 3a to the first monomode fiber 2a, two new wave fronts which propagate in the $LP_{01}$ mode and in the even $LP_{11}$ mode. Both fronts are still in phase at the start of the fiber, since they are generated by a common initial front. The coupling to the first bimode fiber in the first splice 3a takes place, in this case, preferably in such a manner that the intensities of the $LP_{01}$ and $LP_{11}$ modes are approximately equal.

Since the effective refractive indices $n(LP_{01})$ and $n(LP_{11})$ for the two modes are different, an optical path difference $$\text{delta } L = \text{delta } L_1 = l(n(LP_{01}) - n(LP_{11}))$$

has accumulated at the end of the first bimode fiber 4a between the two fronts (in this case, 1 designates the length of the first bimode fiber 4a). Delta L is such that no interference effects take place at the end of the first bimode fiber 4a. The two wave fronts excite, in a (likewise polarization-conserving) second monomode fiber 2b, coupled via a second splice 3b, two new fronts which both propagate in the $LP_{01}$ mode. Thus, the path difference delta L is conserved in this fiber. The coupling takes place in such a way that the $LP_{01}$ and $LP_{11}$ modes are coupled in, in approximately equal proportions, into the second monomode fiber 2b.

In a second bimode fiber 4b, coupled via a third splice, the two wave fronts coming from the second monomode fiber 2b excite in each instance two new fronts, of which one propagates in the $LP_{01}$ mode and one in the $LP_{11}$ mode, respectively. Again, the $LP_{01}$ and $LP_{11}$ modes have approximately equal intensities (in order to be able better to track the wave fronts, those which originate from the $LP_{01}$ mode of the first bimode fiber 4a are provided, in FIG. 1, with one transverse stroke and those which originate from the $LP_{11}$ mode are provided with two transverse strokes).

The path difference delta L between the $LP_{01}$ and the $LP_{11}$ front pairs respectively remains conserved along the second bimode fiber 4b. However, a phase difference delta $L_2$ does accumulate between the $LP_{01}$ front pair on the one hand and the $LP_{11}$ front pair on the other hand. If the two bimode fibers 4a and 4b are identical with respect to their fiber parameters and length, then the following is applicable: $|\text{delta } L_2| = |\text{delta } L_1| = |\text{delta } L|$. At the exit end of the second bimode fiber there are path differences of zero, delta $L_1$ and 2*delta $L_1$ between the light waves of the $LP_{01}$ mode on the one hand and the waves of the $LP_{11}$ mode on the other hand. Mode components with the path difference zero then interfere with one another, while the other components deliver a constant intensity background. Finally, the interference is evaluated in a downstream detection unit 5.

Figure 2:
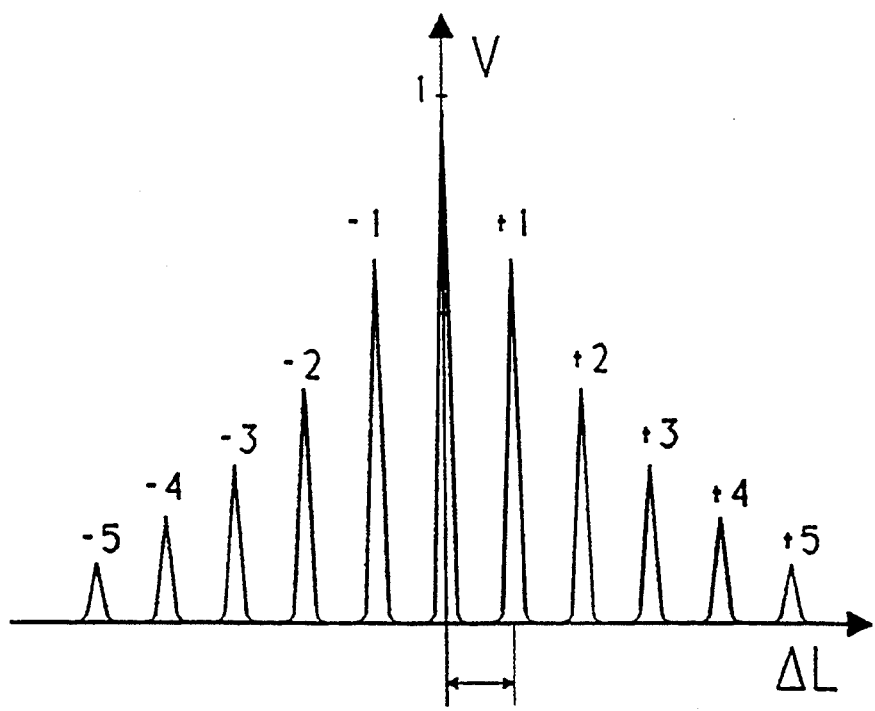
FIG. 2 shows the interference contrast V for a Michelson interferometer illuminated with a multimode laser diode, as a function of the path difference delta L.

In order to provide a more detailed understanding of the tandem bimode fiber interferometer according to the invention, consideration will in the first instance be given to a single Michelson interferometer with a multimode laser diode as light source, as has been described in the above-cited article by A. S. Gerges et al. If the interference contrast V is plotted as a function of the optical path length difference delta L between the two interferometer branches, then the result is a series of equidistant peaks of increasing order ±1, ±2, ±3, etc., which are situated symmetrically with respect to the peak at delta L=0 (FIG. 2). In this case, the interference contrast V is defined as $$V = \frac{I_{max} - I_{min}}{I_{max} + I_{min}}, \quad (5)$$

where $I_{max}$ and $I_{min}$ are the intensities of the maxima and minima of the interference fringe pattern. The position of the peaks is given by $$\text{delta } L = 2*p*l_{cav} \quad p=0, \pm 1, \pm 2, \ldots \quad (6)$$

where p is the order and $l_{cav}$ is the optical length of the laser resonator.

Between the peaks V is very small, so that almost no interference takes place here. For equal amplitudes of the interfering waves, V(delta L=0)=1. With increasing order $|p|$, the height K of the peaks decreases monotonically, in accordance with the relation K(delta L)=exp(−delta L/$L_{cm}$), where $L_{cm}$ is the coherence length corresponding to the spectral laser mode width. Thus, for $|\text{delta } L| \gg L_{cm}$, K tends towards zero.

In the bimode fiber interferometer, the branches of the Michelson interferometer are replaced by the $LP_{01}$ and $LP_{11}$ modes. With increasing fiber length 1, the path difference delta L=1(n($LP_{01}$)−n($LP_{11}$)) between the modes increases linearly with 1. The interference contrast V(1) as a function of the fiber length then passes through the same series of peaks as when using the Michelson interferometer. The maxima are found at fiber lengths $$l_p = 2*p*l_{cav}/n(LP_{01}) - n(LP_{11})). \quad (7)$$

Consequently, the fiber length difference between adjacent peaks is:

$$\text{delta } 1 = 2*l_{cav}\text{delta } n_{eff}$$

where delta $n_{eff}$=n($LP_{01}$)−n($LP_{11}$).

In order that no interference effects should take place at the end of the first bimode fiber 4a, either the path difference delta L which is dependent upon the fiber length must be very much greater than $L_{cm}$ or 1 must be situated at a minimum between two peaks of the function V(1) (interference effects at the end of the first bimode fiber 4a would result in undesired intensity fluctuations).

The light intensity at the exit of the tandem bimode fiber interferometer is given by (similar to equation (7) in the article by A. S. Gerges et al.):

$$I = I_0\{1 + V(\text{delta } L_1)\cos(\Phi_1) + V(\text{delta } L_2)\cos(\Phi_2) + \quad (9)$$
$$(\tfrac{1}{2})V(\text{delta } L_1 + \text{delta } L_2)\cos(\Phi_1 + \Phi_2) +$$
$$(\tfrac{1}{2})V(\text{delta } L_1 - \text{delta } L_2)\cos(\Phi_1 - \Phi_2)\}$$

$\Phi_1$ and $\Phi_2$ are the phase differences corresponding to the path differences delta $L_1$ and delta $L_2$:

$$\Phi_1 = \frac{2*pi*f_0}{c} \text{delta } L_1 \quad (10)$$

and $$\Phi_2 = \frac{2*pi*f_0}{c} \text{delta } L_2. \quad (11)$$

$f_0$ is the center frequency of the laser diode, c is the velocity of light. $I_0$ is proportional to the optical power of the laser diode. Delta $L_1$ and Delta $L_2$ are given by:

$$\text{delta } L_1 = l_1 * \text{delta } n^{(1)}\text{eff} \quad (12)$$

$$\text{delta } L_2 = l_2 * \text{delta} n^{(2)}\text{eff}. \quad (13)$$

$l_1$ and $l_2$ are the lengths of the two bimode fibers 4a and 4b; delta $n^{(1)}$eff and delta $n^{(2)}$eff are the effective refractive index differences of the modes.

As has already been mentioned, delta $n^{(1)}$eff = delta $n^{(2)}$eff = delta $n_{eff}$; $l_1 = l_2 = l$, and consequently, delta $L_1$ = delta $L_2$ = delta L. For a given type of fiber, l is then selected so that $V(\text{delta } L_1) = V(\text{delta } L_2) = V(\text{delta } L) \approx 0$ \quad (14)

and that moreover $$V(\text{delta } L_1 + \text{delta } L_2) = V(2*\text{delta } L) \approx 0. \quad (15)$$

Equation (9) then reads as follows:

$$I = I_0\{1 + \tfrac{1}{2}\} V(\text{delta } L_1 - \text{delta } L_2)\cos z\} \quad (16)$$

where $z = 2*\text{pi}*f_0*(1/c)L_1$-delta $L_2$.

Figure 3A:
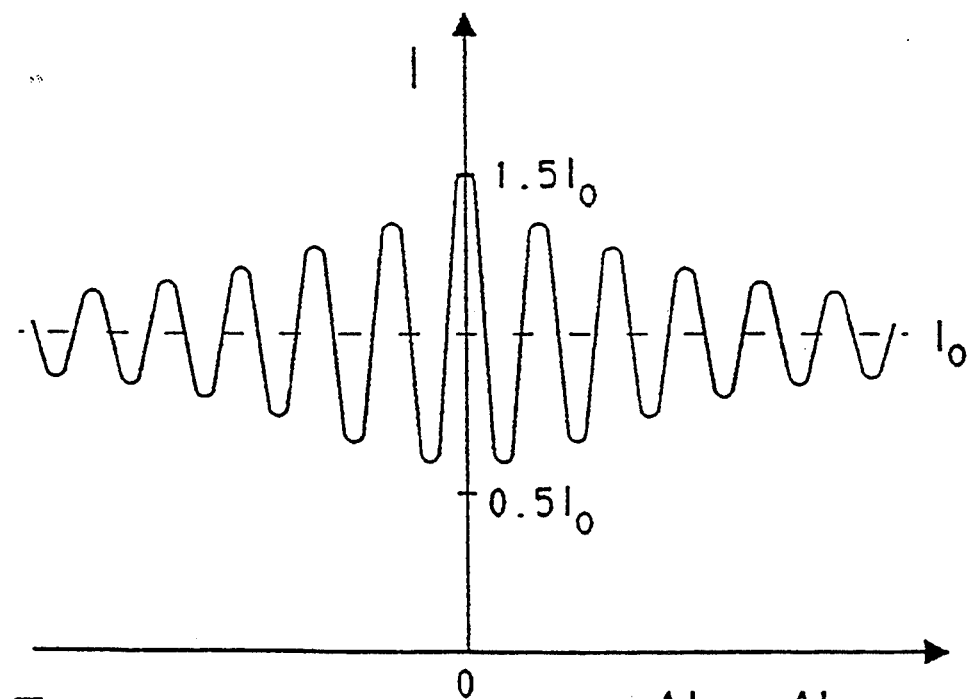
FIG. 3A shows the intensity I at the exit of a tandem interferometer for the 0th-order interference packet as a function of the difference in the path difference (delta $L_1$ −delta $L_2$)
Figure 3B:
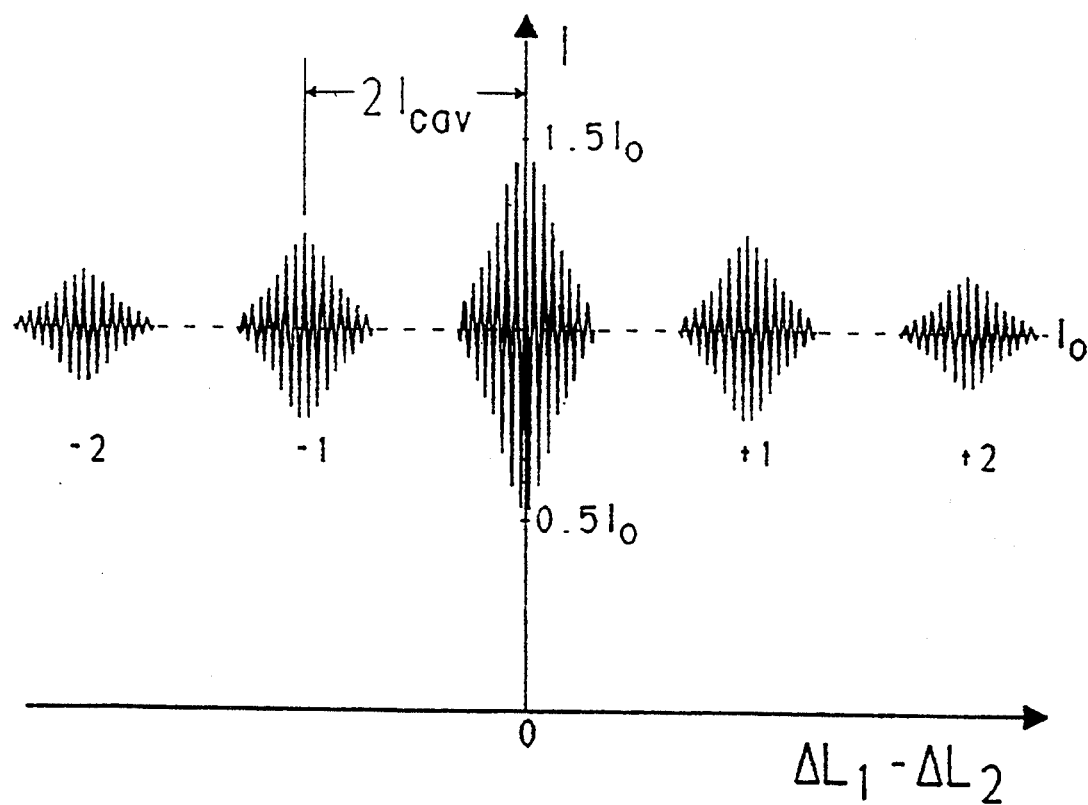
FIG. 3B shows the representation, corresponding to FIG. 3A, for "interference packets" of orders up to ±2.

On this basis, the tandem bimode fiber interferometer behaves as a single interferometer with the path difference delta L = delta $L_1$ − delta $L_2$, with the difference that the interference contrast is reduced by a factor of 2. The intensity I according to equation (16) is graphically represented in FIGS. 3A and 3B. FIG. 3A shows the immediate region about delta $L_1$−delta $L_2$ =0 (order p=0; |delta $L_1$−delta $L_2$| ≦ a few 100 μm). FIG. 3B represents a larger section from the range of values of delta $L_1$ −delta $L_2$ with higher-order "interference packets" (|p|≧0).

By way of comparison, a number of numerical values for the tandem bimode fiber interferometer are compared, hereinbelow, with the Michelson interferometer:

Michelson Interferometer (in air)

For many commercial multimode laser diodes, the half-peak width of the peaks in the function V(delta L) is in the order of magnitude of 200 μm in air. The optical length $l^1$cav of the laser resonator is approximately 1 mm. Thus, the spacing between two maxima is approximately 2 mm. Usually, the height K of the maxima falls off to values of a few percent within the first 10 orders (|p| ≦ 10).

Tandem Bimode Fiber Interferometer

The difference delta $n_{eff} = n(LP_{01}) - n(LP_{11})$ of the effective refractive indices is greatly dependent upon the type of fiber. For a bimode fiber for a wavelength lambda of 780 run, it may be, in approximate terms, within the range between 0.001 and 0.015.

For a fiber with, for example, delta $n_{eff}$=0.01, the following parameters are obtained: The half-power width of the peaks of the function V(1) corresponds to a fiber length difference in the order of magnitude of (200 μm)/delta $n_{eff}$ =2 cm. In order that the total path difference delta $L_1$-delta $L_2$ of the tandem interferometer should still definitely be located within the 0th-order "interference packet" (p=0), accordingly the lengths of the two bimode fibers 4a and 4b should be in precise conformity with one another, to a few millimeters. In practice, there is no problem in complying with such tolerances.

The fiber length difference between two maxima of V(1) is (2 mm)/delta $n_{eff}$=20 cm. Accordingly, the 10th order maximum occurs at a fiber length of 2 m. In consequence of the relatively large spacing between two maxima of V(1), the fiber lengths can easily be set so that the conditions according to equations (14) and (15) are satisfied.

Figure 5:
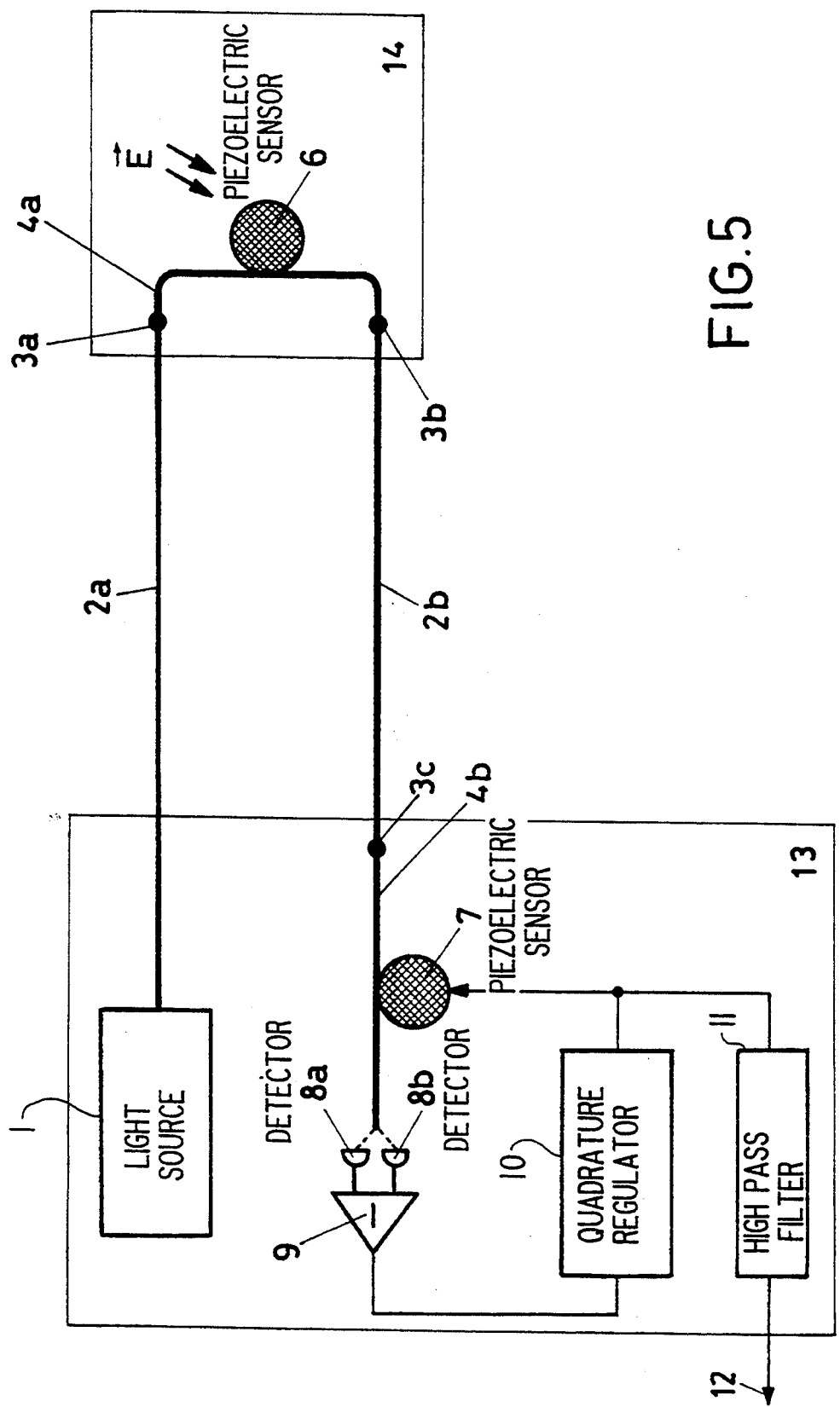
FIG. 5 shows the diagrammatic structure of a preferred embodiment of the sensor according to the invention, with homodyne detection.

A preferred embodiment for the structure of a sensor for the electric field and voltage measurement according to the invention is shown in FIG. 5. In an alternating electric field E, a piezoelectric sensor element 6 (e.g. a quartz crystal) modulates the length of the first bimode fiber 4a and thus also the phase difference between the two excited modes. The phase difference between the waves interfering at the exit end of the second bimode fiber 4b is given by $$\Phi(t) = A*\sin(\text{omega}*t) + \Phi^0{}_1(t) - \Phi^0{}_2(t). \quad (17)$$

$\Phi^0{}_1(t)$ and $\Phi^0{}_2(t)$ are the phase differences between the modes of the two bimode fibers 4a and 4b when no modulation takes place. $\Phi^0{}_1(t)$ and $\Phi^0{}_2(t)$ may change with time, for example in consequence of temperature fluctuations (temperature-dependent fiber lengths). However, the temperature fluctuations of the path differences are very much smaller than the width of the peaks of the function V(delta L), so that the interference contrast is virtually unchanged thereby. Equation (16) then reads as follows:

$$I = I_0\{1 + (\tfrac{1}{2})V\cos(A*\sin(\text{omega}*t) + \Phi^0{}_1(t) - \Phi^0{}_2(t))\} \quad (18)$$

Figure 4:
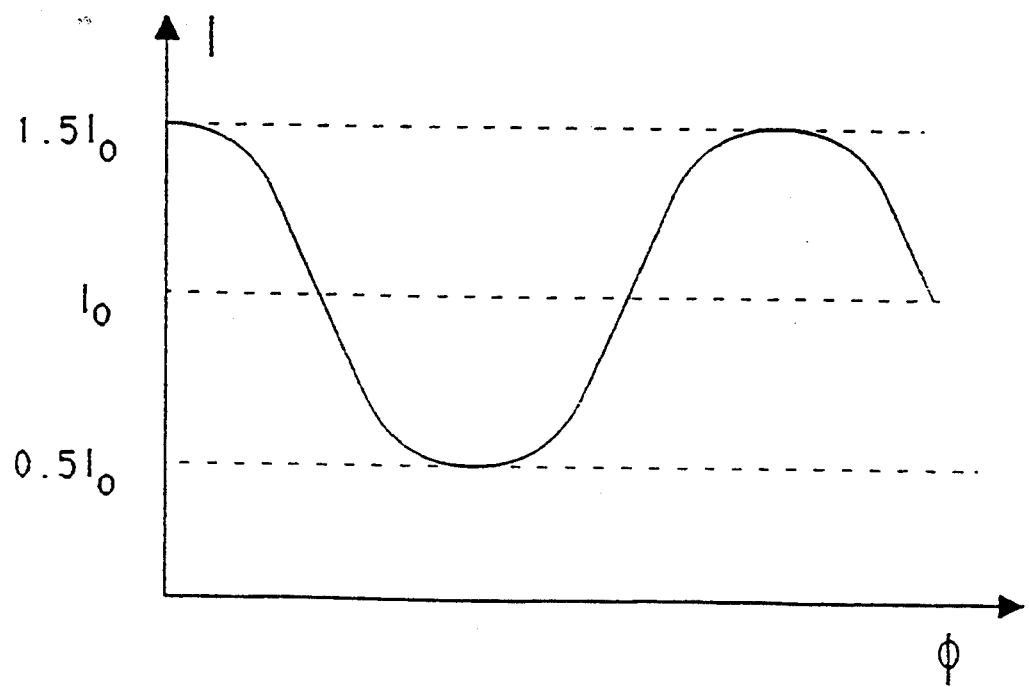
FIG. 4 shows the intensity I for V=1 as a function of the phase Φ.

The intensity I is shown in FIG. 4 for V=1 as a function of the phase Φ. The homodyne detection process, which has already been described earlier, with active phase compensation can then be employed for the signal detection (see the initially cited EP-A1-0,433,824). The difference $\Phi^0{}_1(t) - \Phi^0{}_2(t)$ is set to pi/2 modulo 2*pi, and the term A* sin(omega*t) is compensated by an additional, counter-phase modulation. To this end, a piezoelectric modulator 7 is provided, which is controlled by a quadrature regulator 10. The quadrature regulator 10 receives its input signal from two detectors 8a and 8b, which are disposed at the exit end of the second bimode fiber 4b and which convert the optical interference signal into electrical signals from which the difference is formed by means of a downstream subtractor 9. The measurement signal is extracted from the control signal of the quadrature regulator 10 by means of a high-pass filter 11 and made available at a signal output 12.

In contrast to the known processes, the modulator does not modulate the sensor fiber itself, but the second bimode fiber 4b. The first bimode fiber 4a (the actual sensor fiber) can then remain restricted to the immediate region of the sensor element 6 and does not need to bridge the distance between sensor element and evaluation unit 13. The first bimode fiber forms, together with the sensor element 6, a compact and simply constructed sensor head 14, which is connected only by insensitive monomode fibers 2a, 2b with the evaluation unit 13 in which the second bimode fiber 4b and the modulator 7 with drive are situated Moreover, the terms A*sin(omega*t) and $\Phi^0{}_1(t) - \Phi^0{}_2(t)$ can also—as already described earlier—be compensated by two separate modulators in place of the modulator 7 derived from FIG. 5.

The two (polarization-conserving) bimode fibers preferably have a core of elliptical cross section. The fiber parameters can then be selected so that for the wavelength of the laser diode only the $LP_{01}$ mode and the even $LP_{11}$ mode are viable for propagation (see the initially cited article by B. Y. Kim et al.). In fibers with a round core, the odd $LP_{11}$ mode would also be viable for propagation simultaneously with the even $LP_{11}$ mode.

The two monomode fibers 2a and 2b are preferably designed to be polarization-conserving. However, customary monomode fibers can also be employed. The polarization would then have to be actively controlled, as described in T. Pikaar et al., J. Lightw. Tech. 7, 1982–1987 (1989).

Overall, the invention gives a sturdy, accurate sensor of simple construction.

Obviously, numerous modifications and variations of the present invention are possible in light of the above teachings. It is therefore to be understood that within the scope of the appended claims the invention may be practiced otherwise than as specifically described herein.

What is claimed as new and desired to be secured by Letters Patent of the United States is:

1. A fiber-optic sensor for alternating electric fields and voltages comprising:
   a multimode laser diode for generating a laser beam;
   a first monomode fiber for transmitting the laser beam;
   a first bimode fiber for receiving and propagating the laser beam transmitted by the first monomode fiber, wherein a fundamental mode $LP_{01}$ and an even mode $LP_{11}$ of the fiber propagate in the first bimode fiber with a first path difference between the fundamental mode $LP_{01}$ and even mode $LP_{11}$;
   a piezoelectric sensor element attached to the first bimode fiber such that a change in dimension of the piezoelectric sensor element in electric field results in a change in length in the first bimode fiber;
   a second monomode fiber for receiving an transmitting the laser beam propagated through the first bimode fiber;
   a second bimode fiber for receiving and propagating the laser beam transmitted by the second monomode fiber, wherein the fundamental mode $LP_{01}$ and the even mode $LP_{11}$ of the laser beam propagate in the second bimode fiber with a second path difference between the fundamental mode $LP_{01}$ and even mode $LP_{11}$; and
   means for varying a length of the second bimode fiber to compensate for the change in length of the first bimode fiber induced by the piezoelectric sensor element.

2. The fiber-optic sensor according to claim 1, wherein the first and second monomode fibers are polarization conserving.

3. The fiber-optic sensor according to claim 1, wherein the first and second bimode fibers have equal group refractive index differences between the fundamental mode $LP_{01}$ and even mode $LP_{11}$ and have equal lengths.

4. The fiber-optic sensor according to claim 1, wherein the means for varying the length of the second bimode fiber comprises:
   a piezoelectric modulator connected to the second bimode fiber;
   two detectors for detecting two lobes of an interference pattern between the fundamental mode $LP_{01}$ and even mode $LP_{11}$ at an output of the second bimode fiber;
   a subtractor for subtracting the intensities detected by the two detectors; and
   a quadrature regulator for controlling the piezoelectric modulator based on an output of the subtractor.

5. A fiber-optic sensor for alternating electric fields and voltages comprising:
   a multimode laser diode for generating a laser beam;
   a first monomode fiber for transmitting the laser beam;
   a sensor head comprising:
      a first bimode fiber for receiving and propagating the laser beam transmitted by the first monomode fiber, wherein a fundamental mode $LP_{01}$ and an even mode $LP_{11}$ of the fiber propagate in the first bimode fiber with a first path difference between the fundamental mode $LP_{01}$ and even mode $LP_{11}$;
      a piezoelectric sensor element attached to the first bimode fiber such that a change in dimension of the piezoelectric sensor element in electric field results in a change in length in the first bimode fiber;
   a second monomode fiber for receiving and transmitting the laser beam propagated through the first bimode fiber;
   an evaluating unit comprising:
      a second bimode fiber for receiving and propagating the laser beam transmitted by the second monomode fiber, wherein the fundamental mode $LP_{01}$ and the even mode $LP_{11}$ of the laser beam propagate in the second bimode fiber with a second path difference between the fundamental mode $LP_{01}$ and even mode $LP_{11}$; and
      means for varying a length of the second bimode fiber to compensate for the change in length of the first bimode fiber induced by the piezoelectric sensor element.

6. The fiber-optic sensor according to claim 5, wherein the first and second monomode fibers are polarization conserving.

7. The fiber-optic sensor according to claim 5, wherein the first and second bimode fibers have equal group refractive index differences between the fundamental mode $LP_{01}$ and even mode $LP_{11}$ and have equal lengths.

8. The fiber-optic sensor according to claim 5, wherein the means for varying the length of the second bimode fiber comprises:
   a piezoelectric modulator connected to the second bimode fiber;
   two detectors for detecting two lobes of an interference pattern between the fundamental mode $LP_{01}$ and even mode $LP_{11}$ at an output of the second bimode fiber;
   a subtractor for subtracting the intensities detected by the two detectors; and
   a quadrature regulator for controlling the piezoelectric modulator based on an output of the subtractor.

* * * * *